US012580033B2

(12) United States Patent
Lin et al.

(10) Patent No.: US 12,580,033 B2
(45) Date of Patent: Mar. 17, 2026

(54) READ-ONLY MEMORY METHOD, LAYOUT, AND DEVICE

(71) Applicant: TAIWAN SEMICONDUCTOR MANUFACTURING COMPANY, LTD., Hsinchu (TW)

(72) Inventors: Ku-Feng Lin, Hsinchu (TW); Chia-En Huang, Hsinchu (TW); Chieh Lee, Hsinchu (TW); Kazumasa Uno, Hsinchu (TW); Ching-Wei Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 223 days.

(21) Appl. No.: 18/346,736

(22) Filed: Jul. 3, 2023

(65) Prior Publication Data

US 2025/0014659 A1 Jan. 9, 2025

(51) Int. Cl.
| | |
|---|---|
| *G11C 17/00* | (2006.01) |
| *G11C 5/06* | (2006.01) |
| *G11C 17/12* | (2006.01) |
| *H01L 23/522* | (2006.01) |
| *H01L 23/528* | (2006.01) |
| *H10B 20/00* | (2023.01) |
| *H10B 20/20* | (2023.01) |

(52) U.S. Cl.
CPC .............. *G11C 17/12* (2013.01); *G11C 5/063* (2013.01); *H01L 23/5226* (2013.01); *H01L 23/5283* (2013.01); *H10B 20/20* (2023.02); *H10B 20/40* (2023.02)

(58) Field of Classification Search
CPC ........ G11C 17/22; G11C 5/063; H10B 20/40; H10B 20/20; H01L 23/5226; H01L 23/5283
USPC ......................................................... 365/104
See application file for complete search history.

(56) References Cited

U.S. PATENT DOCUMENTS

| | | | | |
|---|---|---|---|---|
| 4,888,735 A * | 12/1989 | Lee ......................... | G11C 16/10 | |
| | | | 257/E27.103 | |
| 5,787,033 A * | 7/1998 | Maeno ................... | H10B 20/00 | |
| | | | 365/182 | |
| 6,031,771 A * | 2/2000 | Yiu ......................... | G11C 29/80 | |
| | | | 365/201 | |
| 6,618,282 B1 * | 9/2003 | Poplevine .............. | G11C 7/106 | |
| | | | 365/94 | |
| 6,642,587 B1 * | 11/2003 | Poplevine ............ | H10B 20/367 | |
| | | | 257/E21.675 | |
| 6,853,072 B2 * | 2/2005 | Asano ..................... | H01L 24/03 | |
| | | | 257/187 | |
| 6,862,223 B1 * | 3/2005 | Lee ......................... | H10B 41/35 | |
| | | | 257/E27.103 | |

(Continued)

*Primary Examiner* — Viet Q Nguyen
(74) *Attorney, Agent, or Firm* — Hauptman Ham, LLP

(57) ABSTRACT

A method of generating an IC layout diagram includes dividing a column of NOR-type read-only memory (ROM) bit cells into a plurality of N-bit groups separated by isolation features, wherein each group includes the number of bits N greater than two, based on a ROM code programming pattern of the column, assigning one or more logic patterns to each N-bit group of the plurality of N-bit groups, and storing an IC layout diagram including the logic patterns in a storage device.

20 Claims, 15 Drawing Sheets

(56)     References Cited

U.S. PATENT DOCUMENTS

| | | | | |
|---|---|---|---|---|
| 6,967,866 | B2 * | 11/2005 | Hirata | G11C 17/12 |
| | | | | 365/174 |
| 7,002,827 | B1 * | 2/2006 | Sabharwal | H10B 20/00 |
| | | | | 257/E27.102 |
| 7,649,777 | B2 * | 1/2010 | Ichige | H10B 43/30 |
| | | | | 365/185.05 |
| 8,120,939 | B2 * | 2/2012 | Liaw | H10D 89/10 |
| | | | | 365/103 |
| 8,134,870 | B2 * | 3/2012 | Alami | G11C 17/12 |
| | | | | 365/185.12 |
| 8,212,295 | B2 | 7/2012 | Liaw | |
| 8,296,705 | B2 * | 10/2012 | Yang | H10B 20/34 |
| | | | | 716/139 |
| 9,064,583 | B2 * | 6/2015 | Roy | G11C 17/12 |
| 9,659,137 | B2 * | 5/2017 | Lee | G06F 30/398 |
| 9,941,290 | B2 * | 4/2018 | Hsieh | H10D 64/017 |
| 10,580,499 | B2 * | 3/2020 | Lu | H10D 89/10 |
| 10,685,969 | B2 * | 6/2020 | Hsieh | H10B 20/367 |
| 12,279,419 | B2 * | 4/2025 | Sakai | G11C 17/12 |
| 2003/0141594 | A1 * | 7/2003 | Shinohara | H10B 20/00 |
| | | | | 257/E27.102 |
| 2011/0055783 | A1 * | 3/2011 | Yang | H10D 89/10 |
| | | | | 716/122 |
| 2017/0352670 | A1 * | 12/2017 | Hsieh | H10D 89/10 |

* cited by examiner

100

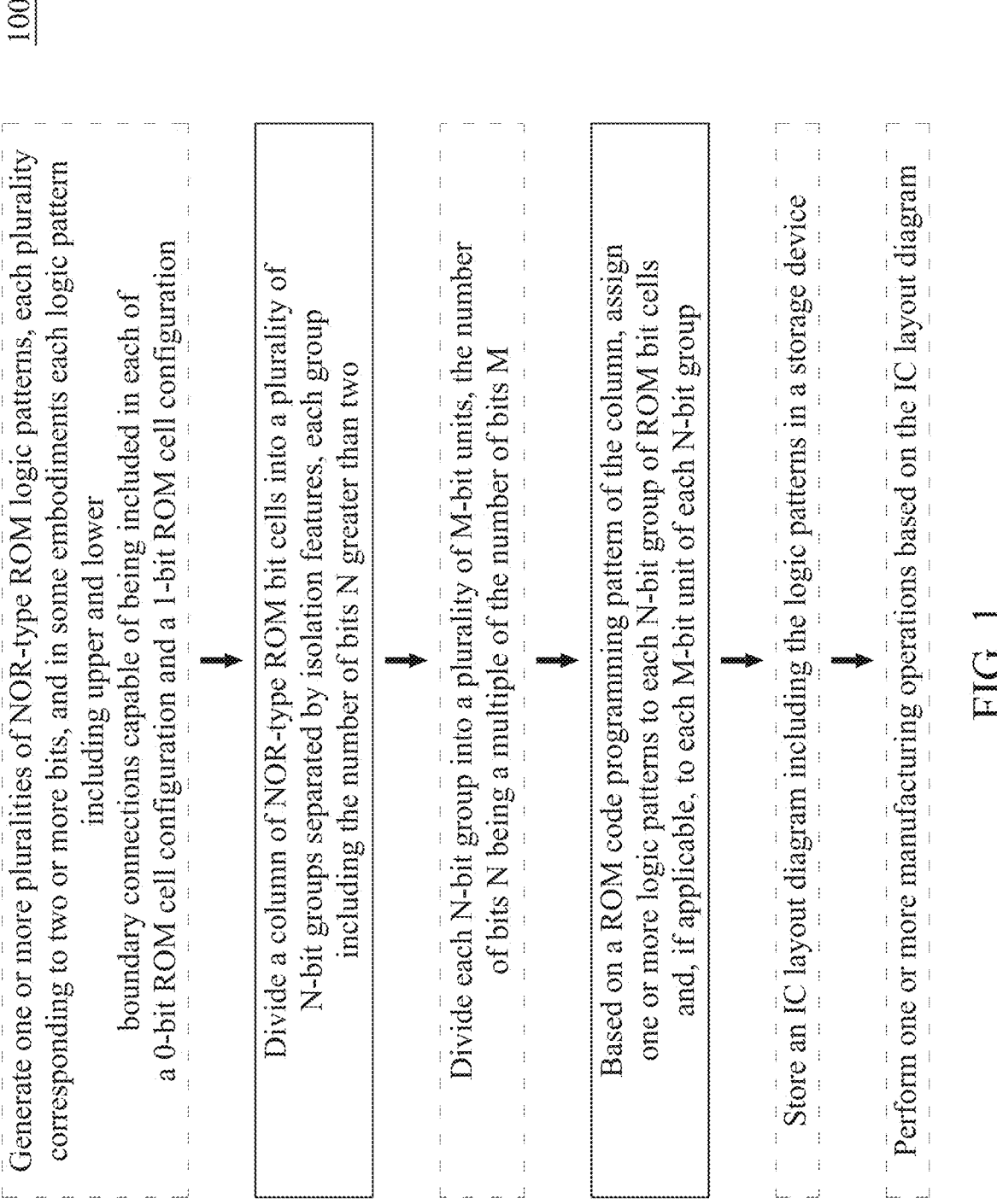

110 — Generate one or more pluralities of NOR-type ROM logic patterns, each plurality corresponding to two or more bits, and in some embodiments each logic pattern including upper and lower boundary connections capable of being included in each of a 0-bit ROM cell configuration and a 1-bit ROM cell configuration 120 — Divide a column of NOR-type ROM bit cells into a plurality of N-bit groups separated by isolation features, each group including the number of bits N greater than two 130 — Divide each N-bit group into a plurality of M-bit units, the number of bits N being a multiple of the number of bits M 140 — Based on a ROM code programming pattern of the column, assign one or more logic patterns to each N-bit group of ROM bit cells and, if applicable, to each M-bit unit of each N-bit group 150 — Store an IC layout diagram including the logic patterns in a storage device 160 — Perform one or more manufacturing operations based on the IC layout diagram

FIG. 1

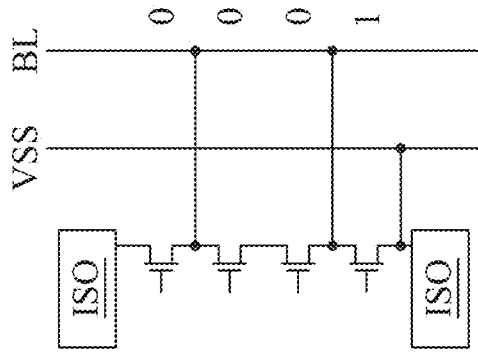
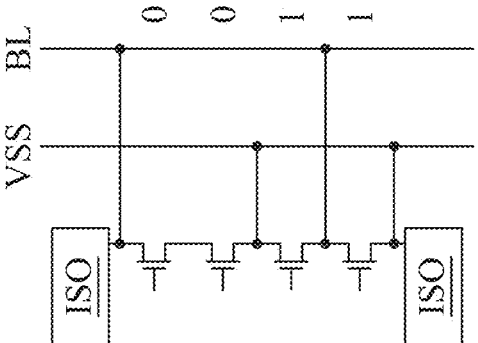
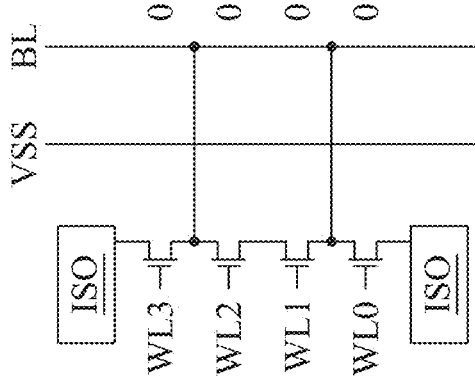
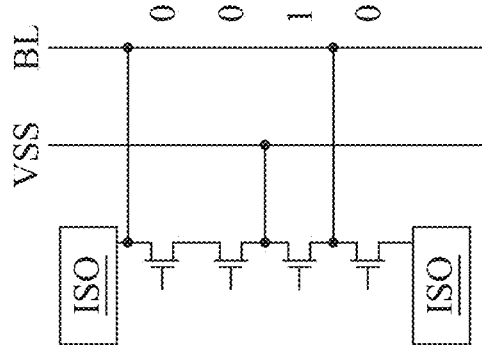
FIG. 2B

200
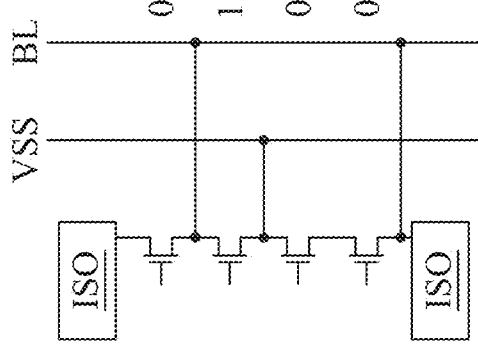
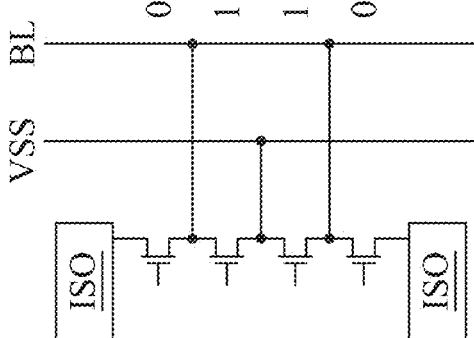
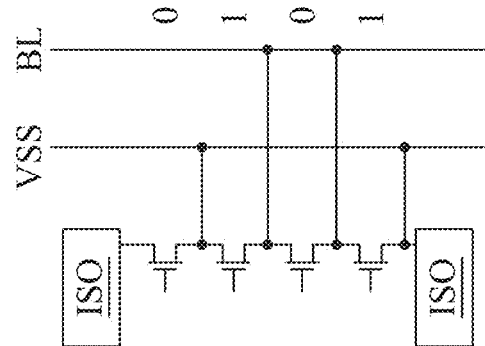
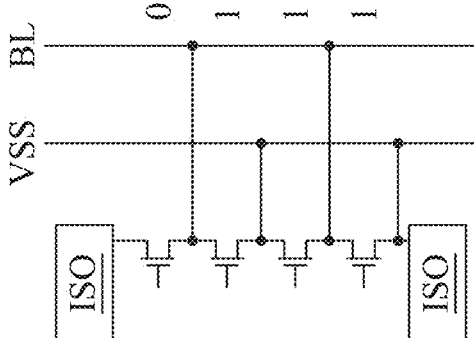
FIG. 2C

200
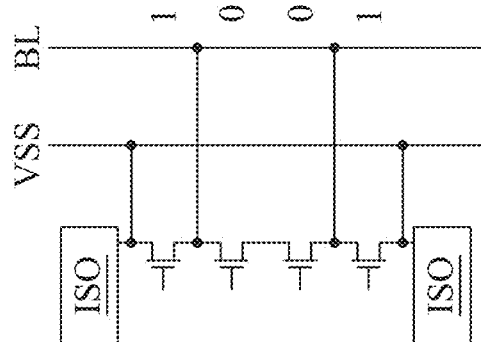
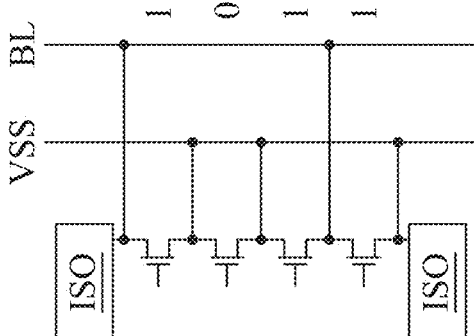
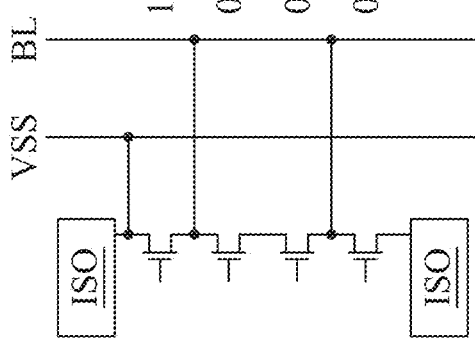
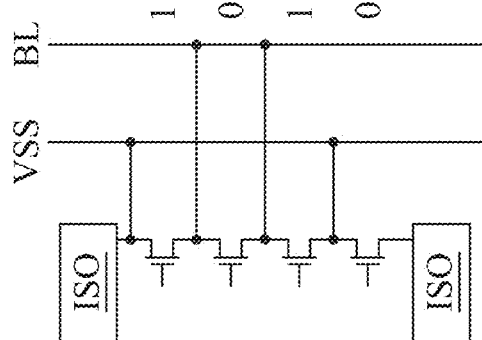
FIG. 2D

200
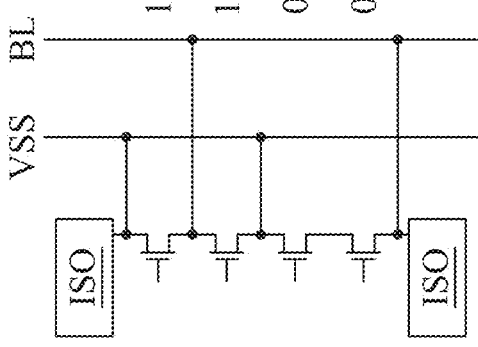
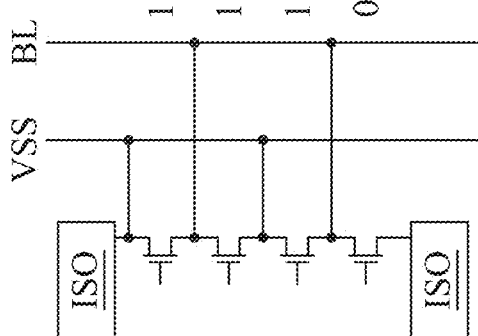
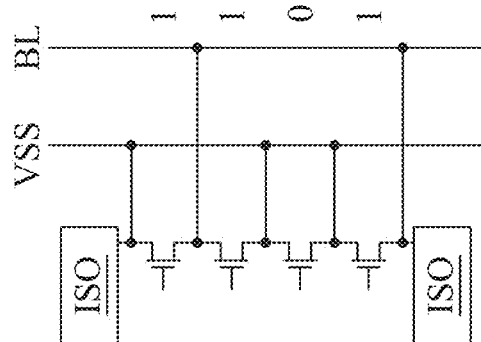
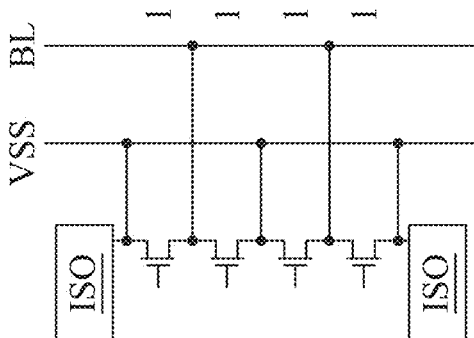
FIG. 2E

400

500
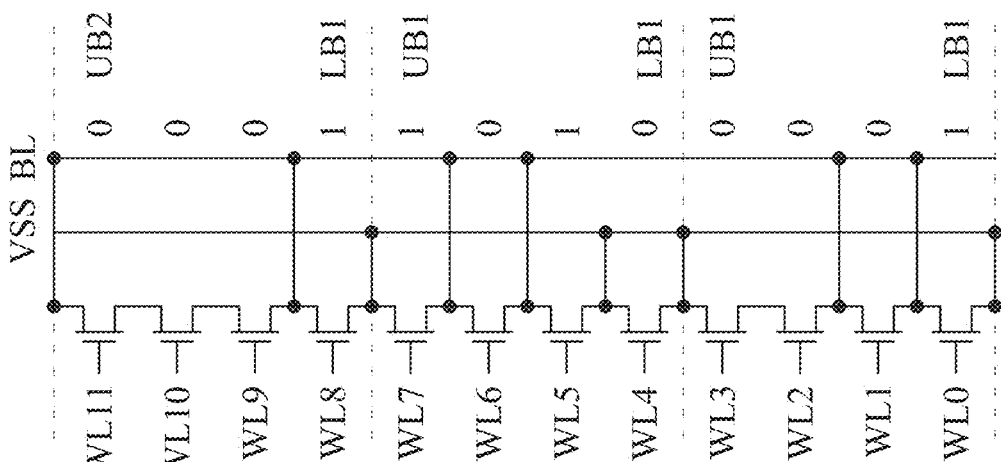
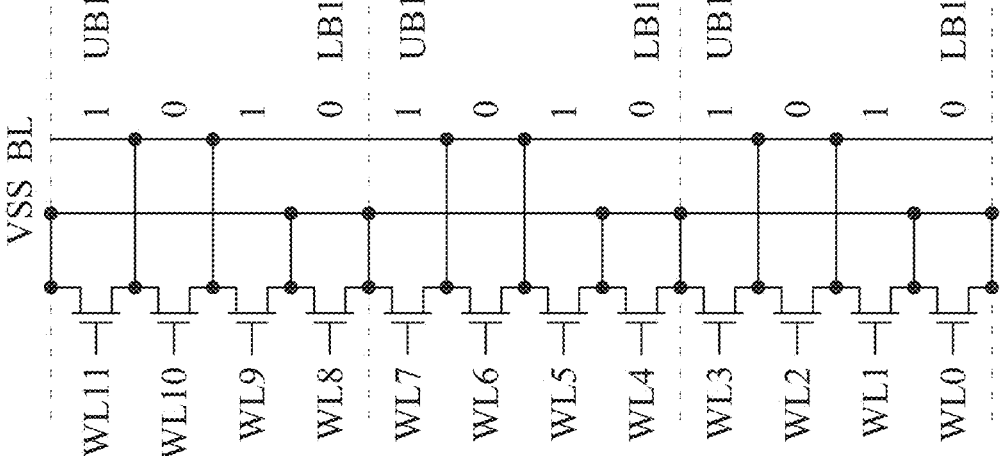
FIG. 5A

500
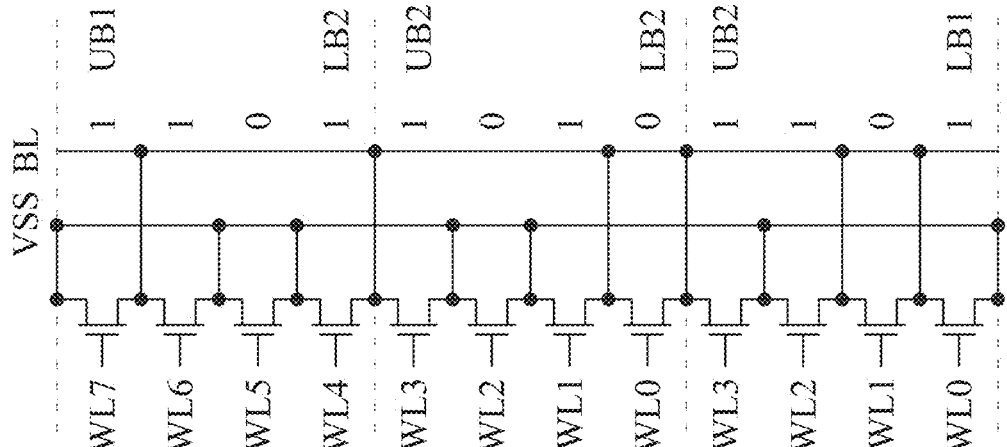
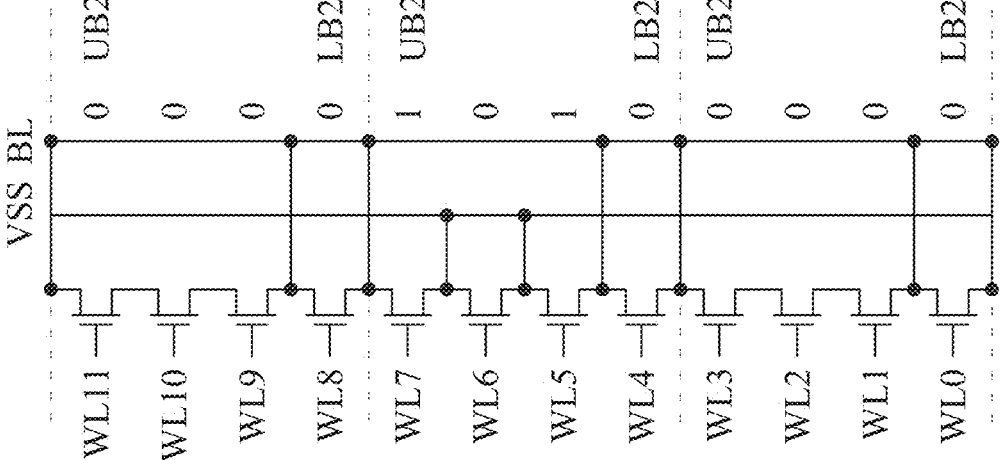
FIG. 5B

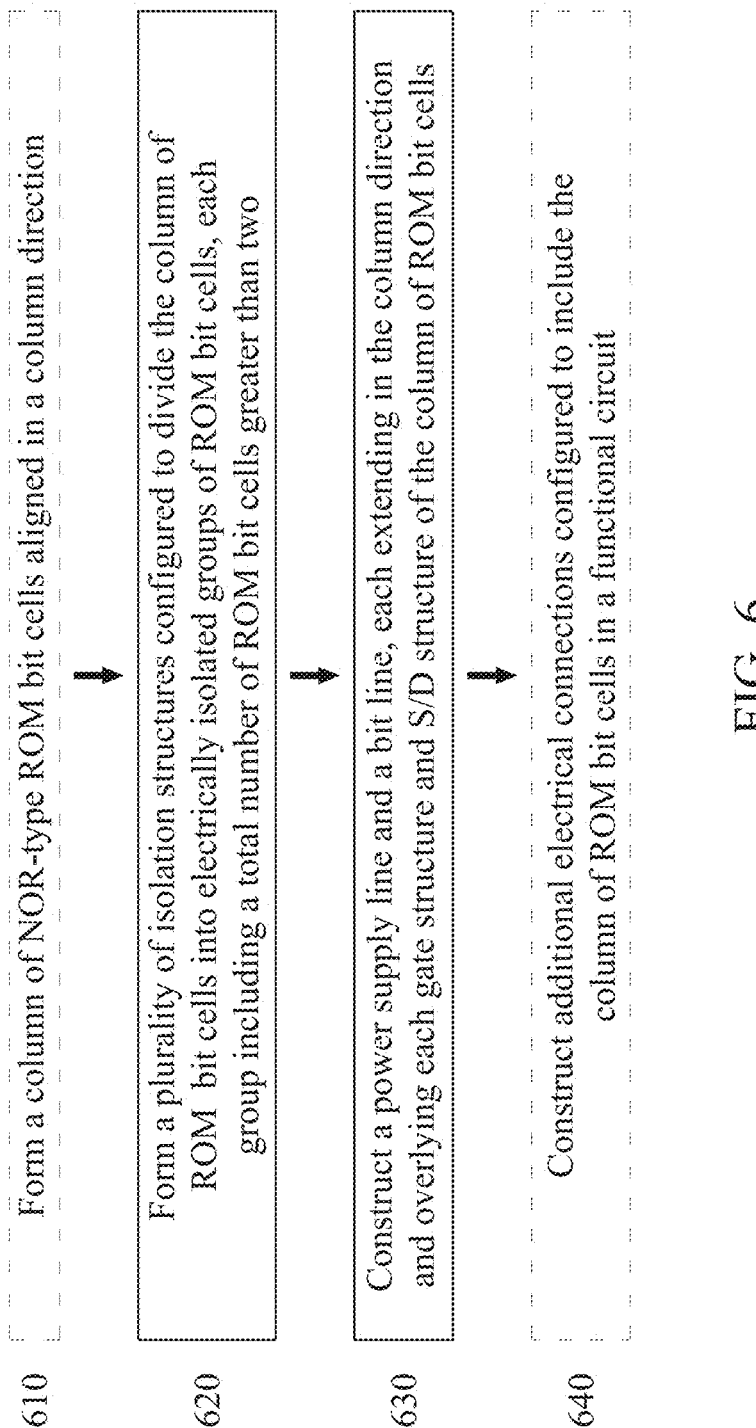

600

610 — Form a column of NOR-type ROM bit cells aligned in a column direction

620 — Form a plurality of isolation structures configured to divide the column of ROM bit cells into electrically isolated groups of ROM bit cells, each group including a total number of ROM bit cells greater than two 630 — Construct a power supply line and a bit line, each extending in the column direction and overlying each gate structure and S/D structure of the column of ROM bit cells 640 — Construct additional electrical connections configured to include the column of ROM bit cells in a functional circuit

FIG. 6

READ-ONLY MEMORY METHOD, LAYOUT, AND DEVICE

BACKGROUND

The ongoing trend in miniaturizing integrated circuits (ICs) has resulted in progressively smaller devices which consume less power, yet provide more functionality at higher speeds than earlier technologies. Such miniaturization has been achieved through design and manufacturing innovations tied to increasingly strict specifications. Various electronic design automation (EDA) tools are used to generate, revise, and verify designs for semiconductor devices while ensuring that IC structure design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a flowchart of a method of generating an IC layout diagram, in accordance with some embodiments.

FIGS. 2A-2E are diagrams of a NOR-type ROM IC, in accordance with some embodiments.

FIGS. 5A and 5B are diagrams of a NOR-type ROM IC, in accordance with some embodiments.

FIG. 6 is a flowchart of a method of manufacturing a NOR-type ROM IC, in accordance with some embodiments.

DETAILED DESCRIPTION

Figure 2A:
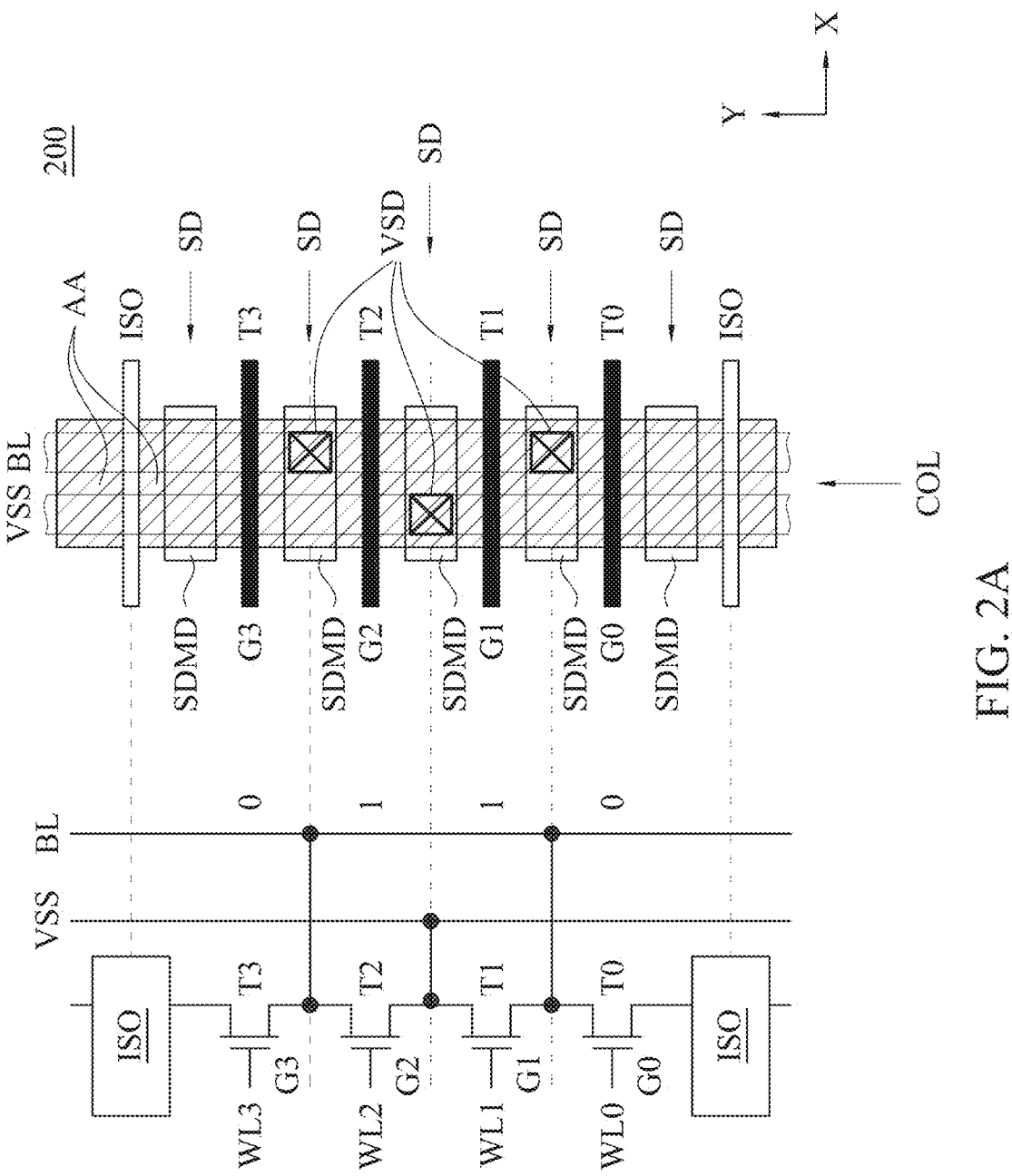

The following disclosure provides many different embodiments, or examples, for implementing different features of the provided subject matter. Specific examples of components, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a read-only memory (ROM) integrated circuit (IC) layout diagram and corresponding manufacturing method and device are based on a (mask programming) method that includes dividing a column of NOR-type ROM bit cells into groups of more than two bit cells each that are separated by isolation features, and using a ROM code programming pattern of the column to assign a logic pattern to each group. In some embodiments, each group is further divided into units, the number of bits per group being a multiple of the number of bits per unit, and the logic patterns are assigned to each unit of each group based on matched bit configurations at unit borders.

By assigning the logic patterns having sizes corresponding to such groups greater than two bits each, cell size is reduced compared to approaches based on two-bit groups separated by isolation features, thereby improving circuit speed and power requirements tied to bit line loading. In embodiments in which the logic patterns translate to ROM cell vias used to define 0-bit and 1-bit configurations, selection and assignment of the logic patterns allow an overall number of vias and corresponding via density and uniformity to be controlled, thereby improving bit line loading compared to approaches in which such control is not enabled. Compared to other approaches, e.g., assigning ROM code patterns at the column level, the selection and assignment of the logic patterns also serve to reduce the number of programming pattern combinations, thereby simplifying ROM code programming patterns for memory compiler design and production.

As discussed below, FIG. 1 is a flowchart of a method 100 of generating a NOR-type ROM IC layout diagram in accordance with the various embodiments, e.g., using a system 700 discussed below with respect to FIG. 7, as illustrated by the non-limiting examples depicted in FIGS. 2A-5B, and FIG. 6 is a flowchart of a method 600 of manufacturing a NOR-type ROM IC based on a corresponding IC layout diagram, e.g., in accordance with an IC manufacturing flow associated with an IC manufacturing system 800 discussed below with respect to FIG. 8.

Each of the figures herein, e.g., FIGS. 2A-5B, is simplified for the purpose of illustration. The figures are views of IC structures and devices with various features included and excluded to facilitate the discussion below. In various embodiments, an IC structure, device and/or layout diagram includes one or more features corresponding to power distribution structures, metal interconnects, contacts, vias, gate structures, source/drain (S/D) structures, bulk connections, or other transistor elements, isolation structures, or the like, in addition to the features depicted in FIGS. 2A-5B.

FIG. 1 is a flowchart of method 100 of generating an IC layout diagram, e.g., an IC layout diagram 200-500 discussed below with respect to FIGS. 2A-5B, in accordance with some embodiments.

In some embodiments, generating the IC layout diagram includes generating the IC layout diagram corresponding to an IC device, e.g., an IC device 200-500 discussed below with respect to FIGS. 2A-5B, manufactured based on the generated IC layout diagram.

In some embodiments, some or all of method 100 is executed by a processor of a computer, e.g., a processor 702 of system 700, discussed below with respect to FIG. 7.

Some or all of the operations of method 100 are capable of being performed as part of a design procedure performed in a design house, e.g., a design house 820 discussed below with respect to FIG. 8.

In some embodiments, the operations of method 100 are performed in the order depicted in FIG. 1. In some embodiments, the operations of method 100 are performed simultaneously and/or in an order other than the order depicted in FIG. 1. In some embodiments, one or more operations are performed before, between, during, and/or after performing one or more operations of method 100.

In some embodiments, some or all of the operations of method 100 are included in a mask programming method usable to design and manufacture a mask program array of NOR-type ROM bit cells.

At operation 110, in some embodiments, one or more pluralities of NOR-type ROM logic patterns are generated, each plurality corresponding to two or more bit cells of a column of NOR-type ROM bit cells. Generating the one or more pluralities of NOR-type ROM logic patterns includes arranging IC layout features in accordance with configuring each bit cell of a given pattern as one of a logic "1" (1-bit) or logic "0" (0-bit).

In some embodiments, each ROM bit cell includes a field-effect transistor (FET), and configuring a given bit as a logic "1" includes arranging the IC layout features to establish a first electrical connection from one S/D region/ structure of the FET to one of two signal lines, e.g., a power supply line and a bit line, and a second electrical connection from the other S/D region/structure of the FET to the other of the two signal lines. In such embodiments, configuring a given bit as a logic "0" includes arranging the IC layout features to establish electrical connections from both S/D regions/structures to one of the signal lines or to electrically isolate one or both of the S/D regions/structures from one or both of the signal lines.

In some embodiments, arranging the IC layout features corresponds to arranging features corresponding to the FET being a planar FET, a FinFET, or a gate-all-around (GAA) transistor. In some embodiments, arranging the IC layout features corresponds to arranging features corresponding to a device type other than a FET, e.g., a bipolar transistor.

FIG. 2A depicts a non-limiting example of a NOR-type ROM logic pattern 200 and X and Y directions. FIG. 2A includes a schematic diagram of pattern 200 alongside a plan view of an equivalent layout diagram 200 and IC device 200.

In IC layout diagram/device 200, reference designators represent both IC device features and the IC layout features used to at least partially define the corresponding IC device features in a manufacturing process, e.g., method 600 discussed below with respect to FIG. 6 and/or the IC manufacturing flow associated with IC manufacturing system 800 discussed below with respect to FIG. 8. Accordingly, IC layout diagram/device 200 represents a plan view of both an IC layout diagram 200 and a corresponding IC device 200.

The mapping of the schematic diagram of pattern 200 to IC layout diagram/device 200 depicted in FIG. 2A is a non-limiting example applicable to each of schematic diagrams 200-500 depicted in FIGS. 2B-5B and discussed below. Accordingly, each of schematic diagrams 200-500 depicted in FIGS. 2B-5B represents both an electrical configuration of a pattern 200-500 and an equivalent IC layout/ device 200-500 analogous to the example depicted in FIG. 2A. Individual mappings of the schematic diagrams of patterns 200-500 to IC layout diagrams/devices 200-500 are not depicted for the purpose of clarity.

As depicted in FIG. 2A, pattern 200 includes a total of four FETs T0-T3 arranged in a column COL extending in the Y direction between adjacent instances of an isolation feature/structure ISO. FETs T0-T3 include corresponding gate regions/structures G0-G3 coupled to respective word lines WL0-WL3 and thereby configured to receive respective signals WL0-WL3, also referred to as word line signals WL0-WL3 in some embodiments.

Three instances of an active region/area AA extend in the Y direction. A first instance extends between the adjacent instances of isolation feature/structure ISO and is thereby configured to be electrically isolated from additional IC layout features along the Y direction, e.g., the additional instances of active region/area AA included in adjacent instances of a pattern such as pattern 200 that share the corresponding instances of isolation feature/structure ISO.

Each of transistors T0-T3 includes the corresponding gate region/structure G0-G3 overlying the first instance of active region/area AA and instances of S/D region/structure SD adjacent to the corresponding gate region/structure G0-G3. Adjacent pairs of transistors T0/T1, T1/T2, and T2/T3 share the corresponding instances of S/D region/structure SD.

In the embodiment depicted in FIG. 2A, an instance of a metal-like defined (DM) region/segment SDMD overlies each S/D region/structure SD, the portion of active region/ area AA overlapped by an instance of MD region/segment SDMD thereby representing a corresponding instance of S/D region/structure SD.

Each of a power supply line VSS and a bit line BL extends in the Y direction and overlaps/overlies each instance of MD region/segment SDMD and S/D region/structure SD of transistors T0-T3. Each of three instances of a via region/ structure VSD overlaps/overlies an instance of MD region/ segment SDMD and a corresponding one of the shared instances of S/D region/structure SD, and power supply line VSS and bit line BL overlap/overlie the three instances of via region/structure VSD as depicted in FIG. 2A.

An active region/area, e.g., active region/area AA, is a region in the IC layout diagram included in the manufacturing process as part of defining an active area, also referred to as an oxide diffusion or definition (OD), in the semiconductor substrate, either directly or in an n-well or p-well region/area (not shown for the purpose of clarity), in which one or more IC device features, e.g., a S/D structure, is formed. In some embodiments, an active area is an n-type or p-type active area of a planar transistor, a FinFET, or a GAA transistor. In various embodiments, an active area (structure) includes one or more of a semiconductor material, e.g., silicon (Si), silicon-germanium (SiGe), silicon-carbide (SiC), or the like, a dopant material, e.g., boron (B), phosphorous (P), arsenic (As), gallium (Ga), or another suitable material.

In some embodiments, an active area is a region in an IC layout diagram included in the manufacturing process as part of defining a nano-sheet structure, e.g., a continuous volume of one or more layers of one or more semiconductor materials having either n-type or p-type doping. In various embodiments, individual nano-sheet layers include a single monolayer or multiple monolayers of a given semiconductor material.

A S/D region/structure, e.g., S/D region/structure SD, is a region in the IC layout diagram included in the manufacturing process as part of defining a S/D structure, also referred to as a semiconductor structure in some embodiments, configured to have a doping type opposite that of the corresponding active region/area. In some embodiments, a S/D region/structure is configured to have lower resistivity than an adjacent channel feature, e.g., a portion of the corresponding active region/area of a planar FET, a fin structure of a FinFET, or a gate structure of a GAA transistor. In some embodiments, a S/D region/structure includes one or more portions having doping concentrations greater than one or more doping concentrations present in the corresponding channel feature. In some embodiments, a S/D region/structure includes epitaxial regions of a semiconductor material, e.g., Si, SiGe, and/or silicon-carbide SiC.

An MD region/segment, e.g., MD region/segment SDMD, is a conductive region in the IC layout diagram included in the manufacturing process as part of defining an MD segment, also referred to as a conductive segment or MD conductive line or trace, in and/or on the semiconductor substrate. In some embodiments, an MD segment includes a portion of at least one metal layer, e.g., a contact layer, overlying and contacting the substrate and having a thickness sufficiently small to enable formation of an insulation layer between the MD segment and an overlying metal layer, e.g., the first metal layer. In various embodiments, an MD segment includes one or more of copper (Cu), silver (Ag), tungsten (W), titanium (Ti), nickel (Ni), tin (Sn), aluminum (Al) or another metal or material suitable for providing a low resistance electrical connection between IC structure elements, i.e., a resistance level below a predetermined threshold corresponding to one or more tolerance levels of a resistance-based effect on circuit performance.

In various embodiments, an MD segment includes a section of the semiconductor substrate and/or an epitaxial layer having a doping level, e.g., based on an implantation process, sufficient to cause the segment to have the low resistance level. In various embodiments, a doped MD segment includes one or more dopant materials having doping concentrations of about $1*10^{16}$ per cubic centimeter ($cm^{-3}$) or greater.

In some embodiments, a manufacturing process includes two MD layers, and an MD region/segment, e.g., MD region/segment SDMD, refers to both of the two MD layers in the manufacturing process.

A gate region/structure, e.g., a gate region/structure G0-G3, is a region in the IC layout diagram included in the manufacturing process as part of defining a gate structure. A gate structure is a volume including one or more conductive segments, e.g., a gate electrode, including one or more conductive materials, e.g., polysilicon, copper (Cu), aluminum (Al), tungsten (W), cobalt (Co), ruthenium (Ru), or one or more other metals or other suitable materials, substantially surrounded by one or more insulating materials, the one or more conductive segments thereby being configured to control a voltage provided to an adjacent gate dielectric layer.

A gate dielectric layer, e.g., a gate dielectric layer of a gate structure G0-G3, is a volume including one or more insulating materials, e.g., silicon dioxide, silicon nitride ($Si_3N_4$), and/or one or more other suitable material such as a low-k material having a k value less than 3.8 or a high-k material having a k value greater than 3.8 or 7.0 such as aluminum oxide ($Al_2O_3$), hafnium oxide ($HfO_2$), tantalum pentoxide ($Ta_2O_5$), or titanium oxide ($TiO_2$), suitable for providing a high electrical resistance between IC structure elements, i.e., a resistance level above a predetermined threshold corresponding to one or more tolerance levels of a resistance-based effect on circuit performance.

An isolation feature/structure, e.g., isolation feature/structure ISO, is a feature including one or more regions in the IC layout diagram included in the manufacturing process as part of defining an isolation structure configured to electrically isolate adjacent features from each other, e.g., instances of active region/area AA adjacent to each other and aligned along the Y direction.

In some embodiments, an isolation feature/structure, e.g., isolation feature/structure ISO, includes a dielectric region/volume positioned between the adjacent features. A dielectric region is a region in the IC layout diagram included in the manufacturing process as part of defining a volume including one or more insulating materials. In embodiments in which isolation feature/structure ISO depicted in FIG. 2A represents a dielectric region/volume, the instances of active region/area AA are discontinuous at locations of each instance of isolation feature/structure ISO.

In some embodiments, an isolation feature/structure includes a dummy, e.g., electrically isolated, gate region/structure. In some embodiments, an isolation feature/structure includes a gate region/structure electrically connected, e.g., tied-off, to one or more features, e.g., an adjacent instance of S/D region/structure SD, whereby a corresponding transistor is switched off. In embodiments in which isolation feature/structure ISO depicted in FIG. 2A represents an electrically isolated or tied off gate region/structure, the instances of active region/area AA are continuous at locations of each instance of isolation feature/structure ISO.

A metal line, e.g., power supply line VSS orbit line BL, is a region in the IC layout diagram included in the manufacturing process as part of defining a metal line structure including one or more conductive materials, e.g., polysilicon, copper (Cu), aluminum (Al), tungsten (W), cobalt (Co), ruthenium (Ru), or one or more other metals or other suitable materials, in a given metal layer of the manufacturing process. In various embodiments, a metal region/segment corresponds to a first metal layer (also referred to as a metal zero layer in some embodiments), or a second or higher level metal layer of the manufacturing process.

A via region/structure, e.g., a via region/structure VSD, is a region in the IC layout diagram included in the manufacturing process as part of defining a via structure including one or more conductive materials configured to provide an electrical connection between an overlying conductive structure, e.g., a metal line VSS or BL, and an underlying conductive structure, e.g., an MD region/segment such as an instance of MD region/segment SDMD or an S/D region/structure such as an instance of S/D region/structure SD.

In the embodiment depicted in FIG. 2A, transistor T0 includes a first instance of S/D region/structure SD electrically isolated from each of power supply line VSS and bit line BL and a second instance of (shared) S/D region/structure SD electrically connected to bit line BL through an instance of MD region/segment SDMD and an instance of via region/structure VSD, and is thereby configured as a 0-bit cell; transistor T1 includes the instance of MD region/segment SDMD and second instance of S/D region/structure SD and a third instance of (shared) S/D region/structure SD electrically connected to power supply line VSS through an instance of MD region/segment SDMD and an instance of via region/structure VSD, and is thereby configured as a 1-bit cell; transistor T2 includes the instance of MD region/segment SDMD and third instance of S/D region/structure SD and a fourth instance of (shared) S/D region/structure SD electrically connected to bit line BL through an instance of MD region/segment SDMD and an instance of via region/structure VSD, and is thereby configured as a 1-bit cell; and transistor T3 includes the instance of MD region/segment SDMD and fourth instance of S/D region/structure SD and a fifth instance of S/D region/structure SD electrically isolated from each of power supply line VSS and bit line BL, and is thereby configured as a 0-bit cell.

In some embodiments, IC layout diagram/device 200 does not include instances of MD region/segment SDMD, and the instances of S/D region/structure SD are electrically connected to power supply line VSS or bit line BL solely through the instances of via region/structure VSD.

The embodiment of IC layout diagram/device 200 depicted in FIG. 2A is thereby configured as an instance of pattern 200 corresponding to a logic code of 0110. Each of FIGS. 2B-2E similarly depicts instances of pattern 200 corresponding to various logic codes, and omits various reference designators for the purpose of clarity. FIG. 2B depicts instances of pattern 200 corresponding to logic codes 0000, 0001, 0010, and 0011; FIG. 2C depicts instances of pattern 200 corresponding to logic codes 0100, 0101, 0110, and 0111; FIG. 2D depicts instances of pattern 200 corresponding to logic codes 1000, 1001, 1010, and 1011; and FIG. 2E depicts instances of pattern 200 corresponding to logic codes 1100, 1101, 1110, and 1111.

In each of FIGS. 2B-2E (and each of FIGS. 3A-5B discussed below), the electrical connections of the schematic diagrams correspond to instances of via region/structure VSD in corresponding IC layout diagrams/devices that are not shown for the purpose of clarity.

In each of the embodiments depicted in FIGS. 2A-2E, each instance of pattern 200 and thereby IC layout diagram/device 200 includes at least two electrical connections including instances of via region/structure VSD, and is thereby configured to implement a corresponding logic code. The numbers and patterns of electrical connections depicted in FIGS. 2A-2E are non-limiting examples provided for the purpose of illustration. In some embodiments, one or more instances of pattern 200 are otherwise configured to implement a logic code by including electrical connections corresponding to the logic code, e.g., by including fewer than two electrical connections including instances of via region/structure VSD.

The embodiments of pattern 200 and IC layout diagram/device 200 depicted in FIGS. 2A-2E include a total of four n-type transistors T0-T3 corresponding to NOR-type ROM bit cells arranged in column COL including power supply line VSS configured to have a reference voltage level. In various embodiments, pattern 200 and IC layout diagram/device 200 is otherwise configured, e.g., by including fewer or greater than four transistors corresponding to NOR-type ROM bit cells, including p-type transistors, and/or by being arranged in column COL including power supply line VSS configured to have a power supply voltage level.

As discussed above, a 1-bit ROM cell configuration requires electrical connections from the S/D regions/structures of the corresponding transistor to each of power supply line VSS and bit line BL. Accordingly, a given transistor including a S/D region/structure that is not electrically connected to (electrically isolated from) one of power supply line VSS or bit line BL is not capable of being configured as a 1-bit ROM cell.

The embodiments of pattern 200 and IC layout diagram/device 200 depicted in FIGS. 2A-2E include instances in which one of transistors TO or T3 includes an instance of (non-shared) S/D region/structure SD adjacent to an instance of isolation feature/structure ISO and electrically isolated from each of power supply line VSS and bit line BL.

For example, transistor T3 depicted in FIG. 2A includes an instance of S/D region/structure SD, between gate region/structure G3 and the instance of isolation feature/structure ISO adjacent to gate region/structure G3 in the positive Y direction. Because this instance of S/D region/structure SD is electrically isolated from each of power supply line VSS and bit line BL, transistor T3 is not capable of being configured as a 1-bit ROM cell. In this and other such instances, pattern 200 and IC layout diagram/device 200 thereby include upper and/or lower boundary connections that are not capable of being configured as a 1-bit ROM cell.

Figure 3A:
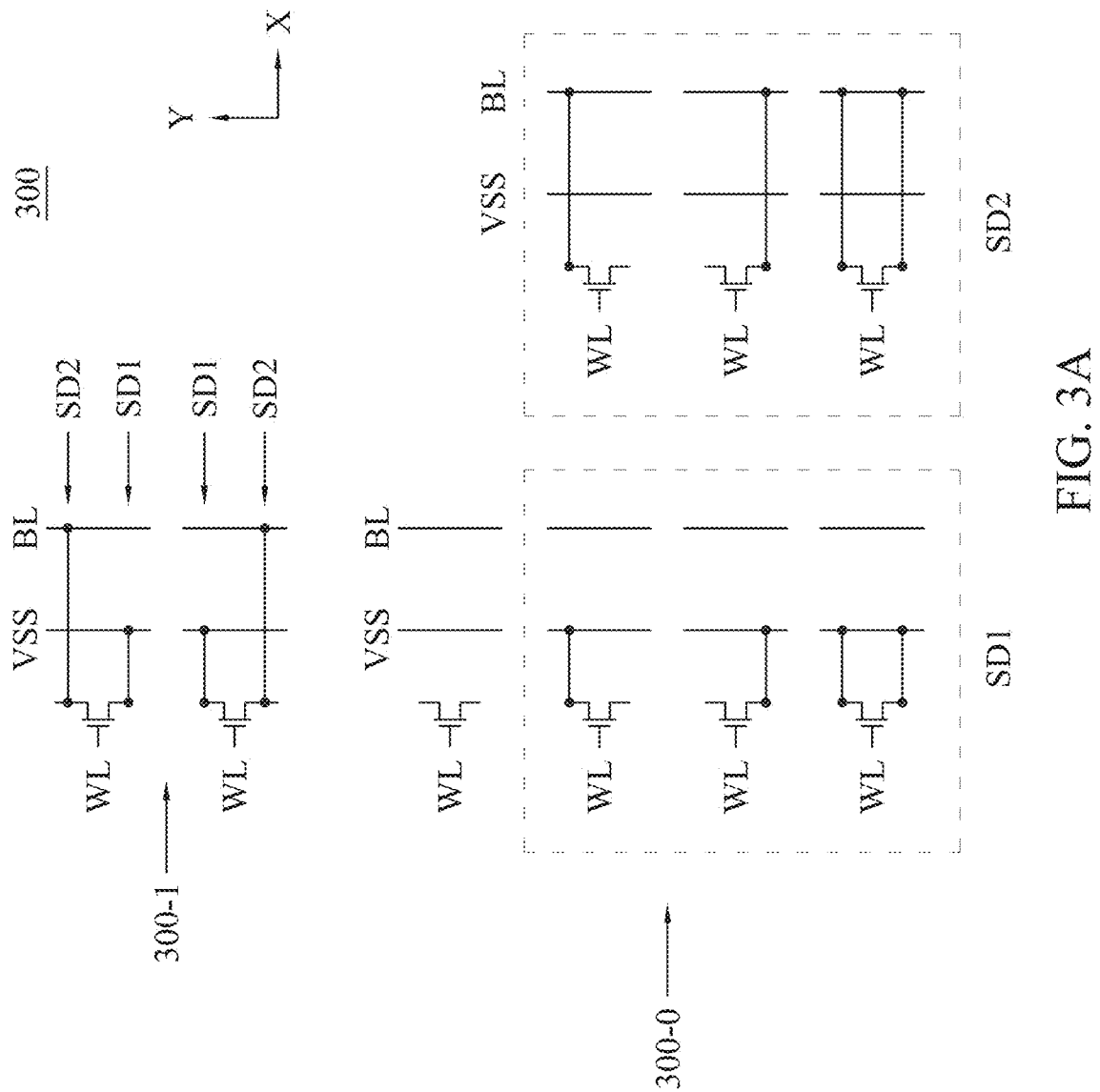
FIGS. 3A-3C are diagrams of a NOR-type ROM IC, in accordance with some embodiments.
Figure 3B:
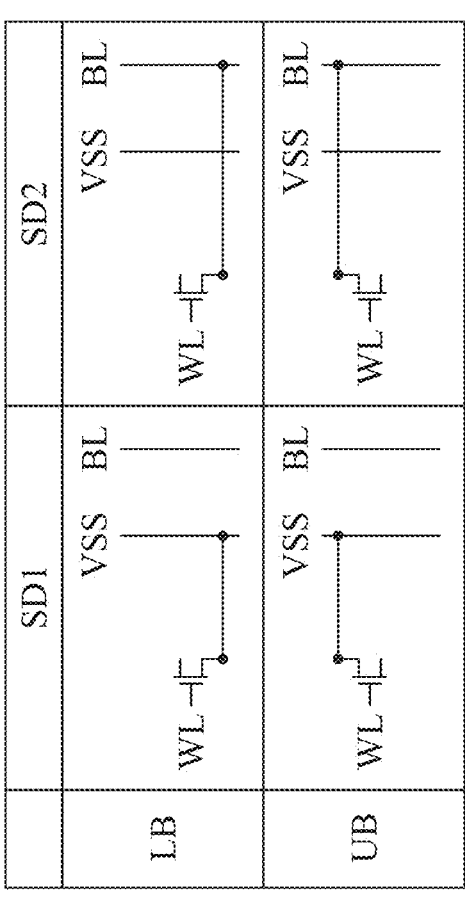
Figure 3C:
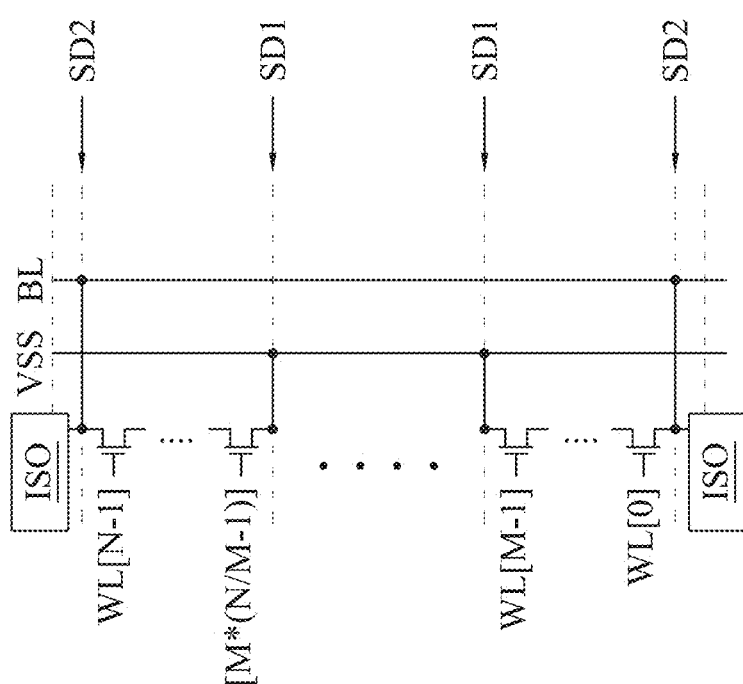

In some embodiments, each instance of a logic pattern includes both upper and lower boundary connections that are capable of being included in each of a 0-bit ROM cell configuration and a 1-bit ROM cell configuration, as illustrated in the embodiments depicted in FIGS. 3A-3C.

Each of FIGS. 3A-3C depicts some or all of pattern 300 (corresponding to IC layout diagram/device 300) and the X and Y directions, in accordance with some embodiments. FIG. 3A depicts instances of ROM bit cell configurations corresponding to 1-bit cells and 0-bit cells, FIG. 3B depicts corresponding upper and lower boundary configurations, and FIG. 3C depicts combinations based on the upper and lower boundary configurations.

As depicted in FIG. 3A, two instances of a pattern 300-1 correspond to 1-bit cell instances of pattern 300, and seven instances of a pattern 300-0 correspond to 0-bit cell instances of pattern 300. Each of the instances of pattern 300-1 includes an electrical connection SD1 including an instance of S/D region/structure SD electrically connected to power supply line VSS and an electrical connection SD2 including an instance of S/D region/structure SD electrically connected to bit line BL.

A first instance of pattern 300-0 includes the corresponding transistor electrically isolated from each of power supply line VSS and bit line BL. Each of another three instances of pattern 300-0 includes electrical connection SD1 and either a second electrical connection to power supply line VSS or an instance of S/D region/structure SD electrically isolated from each of power supply line VSS and bit line BL. Each of a final three instances of pattern 300-0 includes electrical connection SD2 and either a second electrical connection to bit line BL or an instance of S/D region/structure SD electrically isolated from each of power supply line VSS and bit line BL.

As depicted in FIG. 3B, a first connection type can be defined in which the lower boundary LB or upper boundary UB connection corresponds to electrical connection SD1 included in the corresponding instance of 1-bit cell pattern 300-1 or either of the corresponding instances of 0-bit cell pattern 300-0. A second connection type can be defined in which the lower boundary LB or upper boundary UB connection corresponds to electrical connection SD2 included in the corresponding instance of 1-bit cell pattern 300-1 or either of the corresponding instances of 0-bit cell pattern 300-0.

As depicted in FIG. 3C, pattern 300 includes a group of a number N of ROM bit cells corresponding to word lines/signals WL[0]-WL[N−1]. The N-bit group of ROM bit cells is divided into units, each unit including a number M of ROM bit cells. The number N is a multiple of the number M such that pattern 300 includes the total number of M-bit units of ROM bit cells equal to N/M.

As depicted in FIG. 3C, each unit of ROM cells includes upper and lower boundaries including either the first connection type SD1 or the second connection type SD2.

A pattern, e.g., pattern 300, in which each of the units includes upper and lower boundaries being one of the first or second types SD1/SD2 thereby includes adjacent units that are capable of having shared electrical connections by matching an upper boundary connection type of a given unit to a lower boundary connection type of a unit adjacent to the given unit along the positive Y direction.

Figure 4:
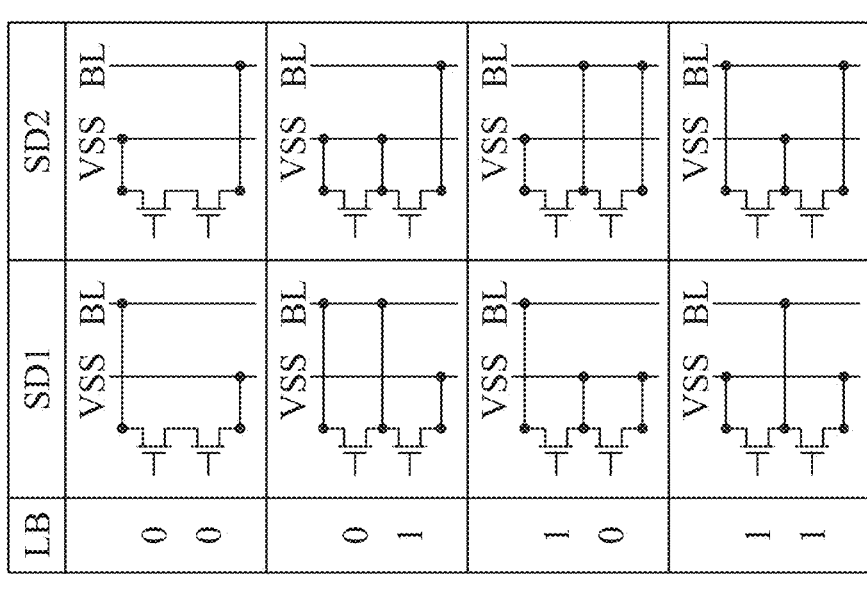
FIG. 4 is a diagram of a NOR-type ROM IC, in accordance with some embodiments.

FIG. 4 depicts instances of pattern 400 (corresponding to IC layout diagram/device 400) including two ROM bit cells arranged along the Y direction, in accordance with some embodiments.

Each instance of pattern 400 depicted in FIG. 4 includes a lower boundary LB connection being one of the first connection type SD1 or the second connection type SD2. For each lower boundary LB connection type, the instances of pattern 400 correspond to logic codes 00, 01, 10, and 11. For each possible two-bit logic code, a given instance of pattern 400 is thereby capable of being positioned adjacent to another instance of pattern 400 having an upper boundary UB being either of the first or second connection types SD1/SD2.

Each of FIGS. 5A and 5B depicts instances of pattern 500 (corresponding to IC layout diagram/device 500) including three units of four ROM bit cells each arranged along the Y direction, in accordance with some embodiments.

As depicted in each of FIGS. 5A and 5B, a given unit of four ROM bit cells shares an electrical connection with an adjacent unit of four ROM bit cells based on each of an upper boundary UB1 and a corresponding adjacent lower boundary LB1 including the first connection type SD1 or each of an upper boundary UB2 and a corresponding adjacent lower boundary LB2 including the second connection type SD2.

The numbers of groups and/or units of bit cells and bit cell configurations depicted in FIGS. 2A-5B are non-limiting examples provided for the purpose of illustration. Other numbers of groups and/or units and other bit cell configurations corresponding to ROM logic codes are within the scope of the present disclosure.

In some embodiments, generating the one or more pluralities or NOR-type ROM logic patterns includes generating each of one or more pluralities of NOR-type ROM logic patterns including greater than two bits and being capable of extending between adjacent isolation structures, e.g., by including borders in which a S/D region/structure is electrically isolated from other features.

In some embodiments, generating each of one or more pluralities of NOR-type ROM logic patterns including greater than two bits includes the number of bits N being equal to four, and each logic pattern including at least two via regions overlapping a power supply or bit line and an S/D region of a ROM bit cell transistor. In some embodiments, generating each of one or more pluralities of NOR-type ROM logic patterns including greater than two bits includes generating one or more instances of pattern 200 discussed above with respect to FIGS. 2A-2E.

In some embodiments, generating the one or more pluralities of NOR-type ROM logic patterns includes generating each of one or more pluralities of NOR-type ROM logic patterns including upper and lower boundary connections capable of being included in each of a 0-bit ROM cell configuration and a 1-bit ROM cell configuration.

In some embodiments, generating each of the one or more pluralities of NOR-type ROM logic patterns including upper and lower boundary connections capable of being included in each of a 0-bit ROM cell configuration and a 1-bit ROM cell configuration includes each of the upper and lower boundaries including one of the first connection type SD1 or the second connection type SD2 as discussed above with respect to FIGS. 3A-5B.

In some embodiments, generating the one or more pluralities of NOR-type ROM logic patterns includes storing the corresponding IC layout diagram, e.g., IC layout diagram 200-500, in a storage device, e.g., a memory 704 of IC layout diagram generation system 700, discussed below with respect to FIG. 7. In some embodiments, storing the IC layout diagram in the storage device includes storing the IC layout diagram in an IC layout library, e.g., an IC layout library 707 of IC layout diagram generation system 700, discussed below with respect to FIG. 7.

At operation 120, a column of NOR-type ROM bit cells is divided into a plurality of N-bit groups separated by isolation features, each group including the number of bits N greater than two. In some embodiments, dividing the column of NOR-type ROM bit cells into the plurality of N-bit groups separated by isolation features includes dividing column COL into groups of NOR-type ROM bit cells corresponding to one of patterns 200-500 separated by isolation features ISO discussed above with respect to FIGS. 2A-5B.

At operation 130, in some embodiments, each N-bit group is divided into a plurality of M-bit units, the number of bits N being a multiple of the number of bits M.

In some embodiments, dividing each n-bit group into the plurality of M-bit units includes dividing each N-bit group into the plurality of units corresponding to one of patterns 300-500 discussed above with respect to FIGS. 3A-5B.

At operation 140, based on a ROM code programming pattern of the column, one or more logic patterns are assigned to each N-bit group of ROM bit cells and, if applicable, to each M-bit unit of each N-bit group.

In some embodiments, assigning the one or more logic patterns to each N-bit group of the plurality of N-bit groups includes assigning a single N-bit logic pattern to each N-bit group of the plurality of N-bit groups, e.g., assigning instances of pattern 200 to each group of four ROM bit cells.

In some embodiments, assigning the one or more logic patterns to each N-bit group of the plurality of N-bit groups includes assigning one or more logic patterns to each M-bit unit of the plurality of M-bit units of each N-bit group of the plurality of N-bit groups, e.g., assigning instances of one of patterns 300-500 discussed above with respect to FIGS. 3A-5B.

In some embodiments, assigning each logic pattern of the one or more logic patterns to each M-bit unit of the plurality of M-bit units of each N-bit group of the plurality of N-bit groups includes assigning the logic pattern including upper and lower boundary electrical connections capable of being included in each of a 0-bit ROM cell configuration and a 1-bit ROM cell configuration, e.g., as discussed above with respect to operation 110.

In some embodiments, the column of NOR-type ROM bit cells includes a power supply line and a bit line, each ROM bit cell includes a transistor including a gate coupled to a word line, and assigning the logic pattern including the upper and lower boundary electrical connections includes arranging IC layout features at each boundary to establish one of a first connection type comprising an electrical connection between a first S/D region of the transistor and the power supply line, or a second connection type comprising an electrical connection between the first S/D region of the transistor and the bit line, e.g., as discussed above with respect to FIGS. 3A-5B.

In some embodiments, assigning the one or more logic patterns to each M-bit unit of the plurality of M-bit units of an N-bit group of the plurality of N-bit groups includes assigning a first logic pattern to a first M-bit unit of the plurality of M-bit units at a first end of the N-bit group, and sequentially assigning additional logic patterns to successive adjacent M-bit units of the plurality of M-bit units, wherein the corresponding logic patterns of adjacent M-bit units of the plurality of M-bit units comprise shared upper and lower boundaries comprising the first or second connection type, e.g., along the positive Y direction in accordance with the embodiments discussed above with respect to FIGS. 5A and 5B.

In some embodiments, assigning the logic pattern including the upper and lower boundary electrical connections includes arranging IC layout features at each boundary whereby the 0-bit ROM cell configuration includes the first connection type and another electrical connection between a second S/D region of the transistor and the power supply line, the second connection type and another electrical connection between the second S/D region of the transistor and the bit line, or one of the first or second connection types and the second S/D region of the transistor electrically isolated from each of the power supply and bit lines, and the 1-bit ROM cell configuration includes the first connection type and another electrical connection between the second S/D region of the transistor and the bit line, or the second connection type and another electrical connection between the second S/D region of the transistor and the power supply line In some embodiments, arranging the IC layout features at each boundary to establish each of the first and second connection types includes overlapping a via region with each of the first S/D region of the transistor and the corresponding power supply line or bit line, e.g., overlapping an instance of via region VSD with each of an instance of S/D region SD and one of power supply line VSS or bit line BL discussed above with respect to FIGS. 2A-5B.

In some embodiments, assigning the one or more logic patterns to each N-bit group of ROM bit cells includes retrieving the one or more logic patterns from a storage device, e.g., memory 704 of IC layout diagram generation system 700, discussed below with respect to FIG. 7. In some embodiments, retrieving the IC layout diagram from the storage device includes retrieving the IC layout diagram from an IC layout library, e.g., IC layout library 707 of IC layout diagram generation system 700, discussed below with respect to FIG. 7.

At operation 150, in some embodiments, an IC layout diagram including the one or more logic patterns is stored in a storage device. In some embodiments, storing the IC layout diagram including the one or more logic patterns in the storage device includes storing the IC layout diagram included in a ROM array programming pattern of a ROM array including the one or more logic patterns.

In some embodiments, storing the IC layout diagram including the one or more logic patterns in the storage device includes storing the IC layout diagram in an IC layout library, e.g., IC layout library 707 of IC layout diagram generation system 700, discussed below with respect to FIG. 7.

In various embodiments, storing the IC layout diagram in the storage device includes storing the IC layout diagram in a non-volatile, computer-readable memory and/or includes storing the IC layout diagram over a network, e.g., network 714 of IC layout diagram generation system 700, discussed below with respect to FIG. 7.

At operation 160, in some embodiments, one or more manufacturing operations are performed based on the IC layout diagram. In some embodiments, performing one or more manufacturing operations includes performing one or more lithographic exposures based on the IC layout diagram. Performing one or more manufacturing operations, e.g., one or more lithographic exposures, based on the IC layout diagram is discussed above with respect to FIG. 6 and below with respect to FIG. 8.

By executing some or all of the operations of method 100, an IC layout diagram is generated corresponding to dividing a column of NOR-type ROM bit cells into groups of more than two bit cells each that are separated by isolation features, and using a ROM code programming pattern of the column to assign a logic pattern to each group. By assigning the logic patterns having sizes corresponding to such groups greater than two bits each, cell size is reduced compared to approaches based on two-bit groups separated by isolation features, thereby improving circuit speed and power requirements tied to bit line loading.

Table 1 below illustrates reduction of cell size relative to a cell pitch of 1.50 times a cell poly pitch (CPP) based on two bits per group of ROM bit cells. As the number of bits per group increases, the cell reduction increases as complexity of ROM code programming increases.

TABLE 1

| #bits group | Cell pitch | Area saving |
|---|---|---|
| 2 | 1.50 CPP/bit | 0.0% |
| 4 | 1.25 CPP/bit | 16.7% |
| 8 | 1.13 CPP/bit | 25.0% |
| 16 | 1.06 CPP/bit | 29.2% |
| 32 | 1.03 CPP/bit | 31.3% |
| 64 | 1.02 CPP/bit | 32.3% |
| 128 | 1.01 CPP/bit | 32.8% |
| No isolation | 1.00 CPP/bit | 33.3% |

In some embodiments, each group is further divided into units, the number of bits per group being a multiple of the number of bits per unit, and the logic patterns are assigned to each unit of each group based on matched bit configurations at unit borders.

In embodiments in which the logic patterns translate to ROM cell vias used to define 0-bit and 1-bit configurations, selection and assignment of the logic patterns allow an overall number of vias and corresponding via density and uniformity to be controlled, thereby improving bit line loading compared to approaches in which such control is not enabled. Compared to other approaches, e.g., assigning ROM code programming patterns at the column level, the selection and assignment of the logic patterns also serve to reduce the number of programming pattern combinations, thereby simplifying ROM code programming patterns for memory compiler design and production Table 2 below illustrates a trade-off in the reduction in ROM code programming complexity as a via density increases for various embodiments of group and unit sizes.

TABLE 2

| N-bit group | M-bit unit | Number of patterns | BL VIA density |
|---|---|---|---|
| 4 | 4 | $2^4 = 16$ | 50% |
|  | 2 | $2^{(2 + 1)} = 8$ | 50%~100% |
| 8 | 8 | $2^8 = 256$ | 50% |
|  | 4 | $2^{(4 + 1)} = 32$ | 50%~75% |
|  | 2 | $2^{(2 + 1)} = 8$ | 50%~100% |
| 16 | 16 | $2^{16} = 65,536$ | 50% |
|  | 8 | $2^{(8 + 1)} = 512$ | 50%~63% |
|  | 4 | $2^{(4 + 1)} = 32$ | 50%~75% |
|  | 2 | $2^{(2 + 1)} = 8$ | 50%~100% |
| . . . |  | Same formula for larger group/unit | |

FIG. 6 is a flowchart of a method 600 of manufacturing an IC device, in accordance with some embodiments.

Method 600 is operable to form one or more of IC devices 200-500 discussed above with respect to FIGS. 1-5B.

In some embodiments, the operations of method 600 are performed in the order depicted in FIG. 6. In some embodiments, the operations of method 600 are performed in an order other than the order depicted in FIG. 6. In some embodiments, one or more additional operations are performed before, during, and/or after the operations of method 600. In some embodiments, performing some or all of the operations of method 600 includes performing one or more operations as discussed below with respect to IC manufacturing system 800 and FIG. 8.

At operation 610, in some embodiments, a column of NOR-type ROM bit cells is formed aligned in a column direction. Forming the NOR-type bit cells includes forming the bit cells in accordance with instances of one of IC devices 200-500 discussed above with respect to FIGS. 2A-5B.

In various embodiments, forming the column of NOR-type ROM bit cells includes performing a plurality of manufacturing operations, e.g., one or more of a lithography, diffusion, deposition, etching, planarizing, or other operation suitable for depositing and forming one or more active areas, gate, S/D, and via structures configured as discussed above with respect to FIGS. 2A-5B.

At operation 620, a plurality of isolation structures are formed configured divide the column of ROM bit cells into electrically isolated groups of ROM bit cells, each group including a total number of ROM bit cells greater than two. In some embodiments, forming the plurality of isolation structures includes forming isolation structures ISO discussed above with respect to FIGS. 2A-5B.

In various embodiments, forming the isolation structures includes performing a plurality of manufacturing operations, e.g., one or more of a lithography, diffusion, deposition, etching, planarizing, or other operation suitable for constructing isolation structures in accordance with the configurations discussed above with respect to FIGS. 2A-5B.

At operation 630, a power supply line and a bit line are constructed, each extending in the column direction and overlying each gate structure and S/D structure of the column of ROM bit cells. In some embodiments, constructing the power supply line and the bit line includes constructing power supply line VSS and bit line BL configured as discussed above with respect to FIGS. 2A-5B.

In various embodiments, constructing the power supply and bit lines includes performing a plurality of manufacturing operations, e.g., one or more of a lithography, diffusion, deposition, etching, planarizing, or other operation suitable for constructing metal lines in accordance with the configurations discussed above with respect to FIGS. 2A-5B.

At operation 640, in some embodiments, additional electrical connections are constructed configured to include the column of ROM bit cells in a functional circuit, e.g., a ROM bit cell array of an IC such as a processor or the like.

In various embodiments, forming the additional electrical connections includes performing a plurality of manufacturing operations, e.g., one or more of a lithography, diffusion, deposition, etching, planarizing, or other operation suitable for constructing vias and metal segments.

By performing some or all of the operations of method 600, a column of NOR-type ROM bit cells is forming in accordance with the configurations discussed above and thereby being capable of realizing the benefits discussed above with respect to method 100 and IC layout diagrams/devices 200-500.

Figure 7:
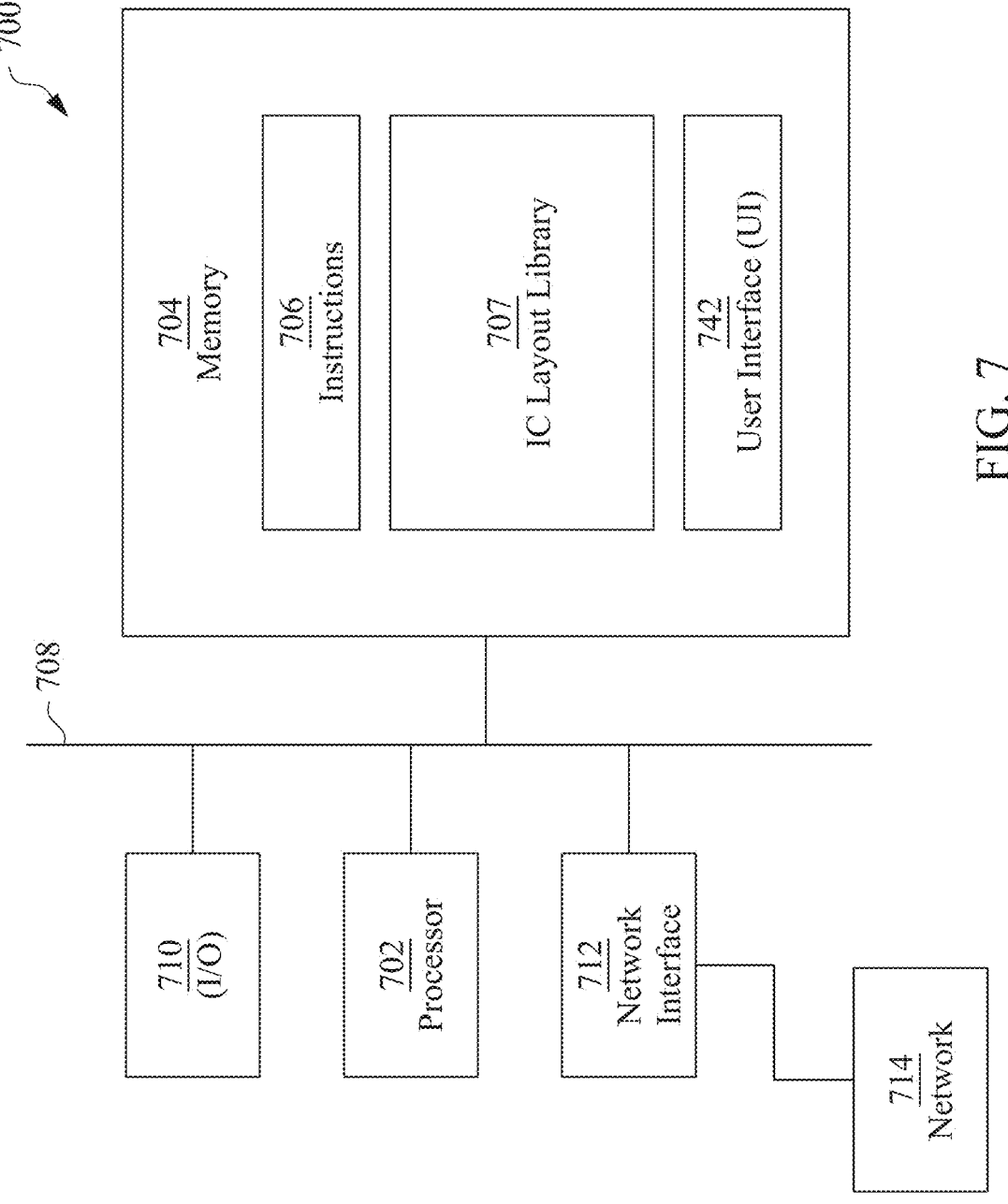
FIG. 7 is a block diagram of an IC layout diagram generation system, in accordance with some embodiments.

FIG. 7 is a block diagram of IC layout diagram generation system 700, in accordance with some embodiments. Methods described herein of designing IC layout diagrams in accordance with one or more embodiments are implementable, for example, using IC layout diagram generation system 700, in accordance with some embodiments.

In some embodiments, IC layout diagram generation system 700 is a general purpose computing device including a hardware processor 702 and a non-transitory, computer-readable storage medium 704. Storage medium 704, amongst other things, is encoded with, i.e., stores, computer program code 706, i.e., a set of executable instructions. Execution of instructions 706 by hardware processor 702 represents (at least in part) an EDA tool which implements a portion or all of a method, e.g., method 100 of generating an IC layout diagram described above with respect to FIGS. 1-5B (hereinafter, the noted processes and/or methods).

Processor 702 is electrically coupled to computer-readable storage medium 704 via a bus 708. Processor 702 is also electrically coupled to an I/O interface 710 by bus 708. A network interface 712 is also electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause IC layout diagram generation system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, computer-readable storage medium 704 stores computer program code 706 configured to cause IC layout diagram generation system 700 (where such execution represents (at least in part) the EDA tool) to be usable for performing a portion or all of the noted processes and/or methods. In one or more embodiments, computer-readable storage medium 704 also stores information which facilitates performing a portion or all of the noted processes and/or methods. In one or more embodiments, computer-readable storage medium 704 stores IC layout library 707 of IC layout diagrams including such IC layout diagrams as disclosed herein, e.g., IC layout diagrams 200-500 discussed above with respect to FIGS. 1-5B.

IC layout diagram generation system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

IC layout diagram generation system 700 also includes network interface 712 coupled to processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more IC layout diagram generation systems 700.

IC layout diagram generation system 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. IC layout diagram generation system 700 is configured to receive information related to a UI through I/O interface 710. The information is stored in computer-readable medium 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by IC layout diagram generation system 700. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
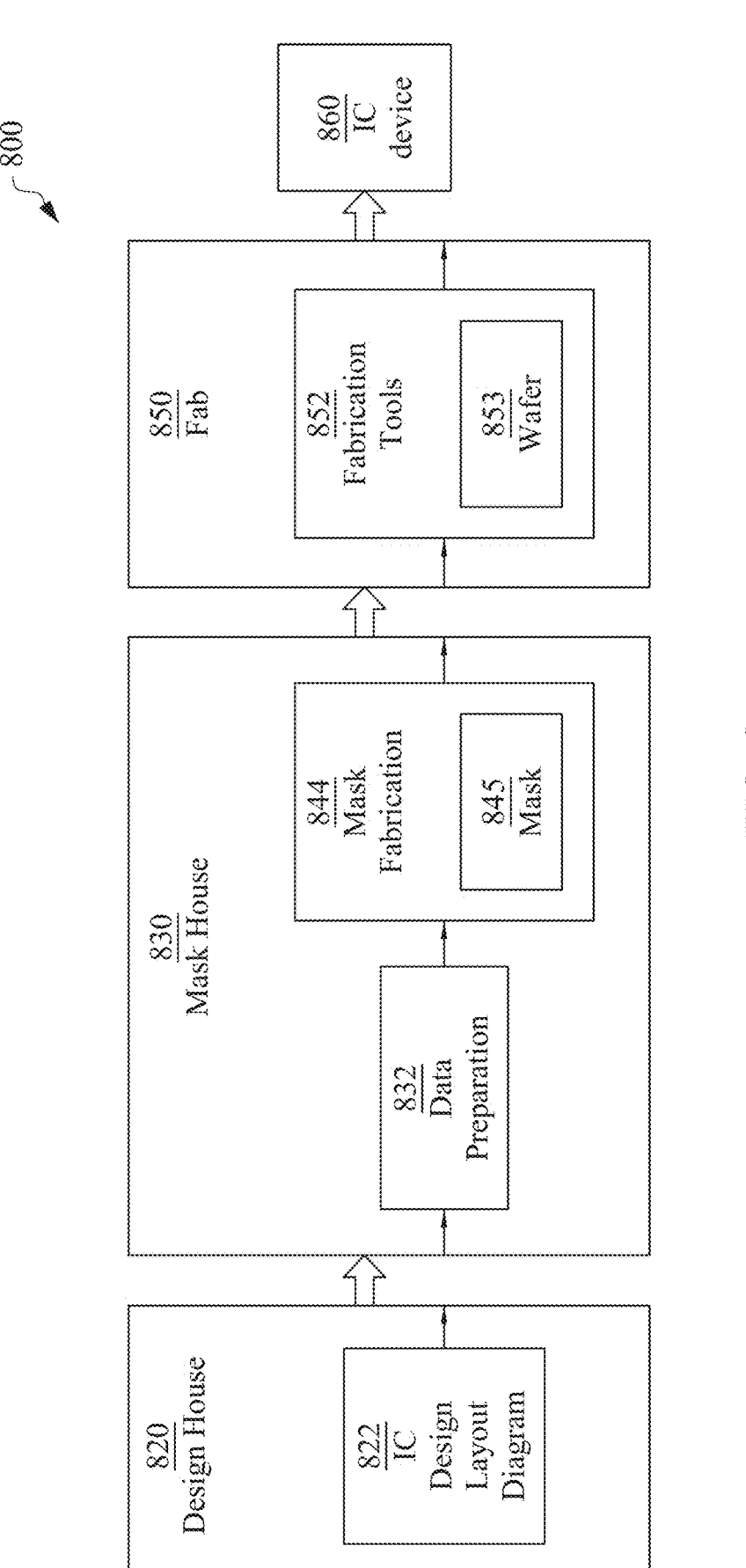
FIG. 8 is a block diagram of an IC manufacturing system, and an IC manufacturing flow associated therewith, in accordance with some embodiments.

FIG. 8 is a block diagram of IC manufacturing system 800, and an IC manufacturing flow associated therewith, in accordance with some embodiments. In some embodiments, based on an IC layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout diagram 822. IC design layout diagram 822 includes various geometrical patterns, e.g., an IC layout diagram 200-500 discussed above with respect to FIGS. 1-5B. The geometrical patterns correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Mask house 830 includes data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file (RDF). Mask data preparation 832 provides the RDF to mask fabrication 844. Mask fabrication 844 includes a mask writer. A mask writer converts the RDF to an image on a substrate, such as a mask (reticle) 845 or a semiconductor wafer 853. The design layout diagram 822 is manipulated by mask data preparation 832 to comply with particular characteristics of the mask writer and/or requirements of IC fab 850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the above description of mask data preparation 832 has been simplified for the purposes of clarity. In some embodiments, data preparation 832 includes additional features such as a logic operation (LOP) to modify the IC design layout diagram 822 according to manufacturing rules. Additionally, the processes applied to IC design layout diagram 822 during data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) or EUV beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 850 includes wafer fabrication tools 852 configured to execute various manufacturing operations on semiconductor wafer 853 such that IC device 860 is fabricated in accordance with the mask(s), e.g., mask 845. In various embodiments, fabrication tools 852 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 850 uses mask(s) 845 fabricated by mask house 830 to fabricate IC device 860. Thus, IC fab 850 at least indirectly uses IC design layout diagram 822 to fabricate IC device 860. In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multi-level interconnects, and the like (formed at subsequent manufacturing steps).

In some embodiments, a method of generating an IC layout diagram includes dividing a column of NOR-type ROM bit cells into a plurality of N-bit groups separated by isolation features, wherein each group includes the number of bits N greater than two, based on a ROM code programming pattern of the column, assigning one or more logic patterns to each N-bit group of the plurality of N-bit groups, and storing an IC layout diagram including the logic patterns in a storage device.

In some embodiments, a ROM IC includes a column of NOR-type ROM bit cells aligned in a column direction, wherein each ROM bit cell includes a transistor including a gate structure extending perpendicular to the column direction, and S/D structures adjacent to the gate structure, a power supply line and a bit line, each extending in the column direction and overlying each gate structure and S/D structure of the column of ROM bit cells, and a plurality of isolation structures configured to divide the column of ROM bit cells into electrically isolated groups of ROM bit cells, wherein each pair of adjacent ROM bit cells within each group of ROM bit cells shares a corresponding S/D structure, and each group of ROM bit cells of the column of ROM bit cells includes a total number of ROM bit cells greater than two.

In some embodiments, a method of manufacturing an IC device includes forming a column of NOR-type ROM bit cells aligned in a column direction, wherein the forming each ROM bit cell includes forming a transistor by constructing a gate structure extending perpendicular to the column direction and forming S/D structures adjacent to the gate structure, forming a plurality of isolation structures configured to divide the column of ROM bit cells into electrically isolated groups of ROM bit cells, and constructing a power supply line and a bit line, each extending in the column direction and overlying each gate structure and S/D structure of the column of ROM bit cells, wherein each pair of adjacent ROM bit cells within each group of ROM bit cells shares a corresponding S/D structure, and each group of ROM bit cells of the column of ROM bit cells includes a total number of ROM bit cells greater than two.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method of generating an integrated circuit (IC) layout diagram, the method comprising:
   dividing a column of NOR-type read-only memory (ROM) bit cells into a plurality of N-bit groups separated by isolation features, wherein each group includes the number of bits N greater than two;
   based on a ROM code programming pattern of the column, assigning one or more logic patterns to each N-bit group of the plurality of N-bit groups; and
   storing an IC layout diagram including the logic patterns in a storage device.

2. The method of claim 1, wherein the assigning the one or more logic patterns to each N-bit group of the plurality of N-bit groups comprises assigning a single N-bit logic pattern to each N-bit group of the plurality of N-bit groups.

3. The method of claim 2, wherein
   the number of bits N is equal to four, and
   each logic pattern comprises at least two via regions overlapping a power supply line or a bit line and a source/drain (S/D) region of a ROM bit cell transistor.

4. The method of claim 1, further comprising:
   dividing each N-bit group into a plurality of M-bit units, wherein
      the number of bits N is a multiple of the number of bits M, and
      the assigning the one or more logic patterns to each N-bit group of the plurality of N-bit groups comprises assigning one or more logic patterns to each M-bit unit of the plurality of M-bit units of each N-bit group of the plurality of N-bit groups.

5. The method of claim 4, wherein
   the assigning each logic pattern of the one or more logic patterns to each M-bit unit of the plurality of M-bit units of each N-bit group of the plurality of N-bit groups comprises assigning the logic pattern comprising upper and lower boundary electrical connections capable of being included in each of a 0-bit ROM cell configuration and a 1-bit ROM cell configuration.

6. The method of claim 5, wherein
   the column of NOR-type ROM bit cells comprises a power supply line and a bit line,
   each ROM bit cell comprises a transistor comprising a gate coupled to a word line, and
   the assigning the logic pattern comprising the upper and lower boundary electrical connections comprises arranging IC layout features at each boundary to establish one of
      a first connection type comprising an electrical connection between a first source/drain (S/D) region of the transistor and the power supply line, or
      a second connection type comprising an electrical connection between the first S/D region of the transistor and the bit line.

7. The method of claim 6, wherein the assigning the one or more logic patterns to each M-bit unit of the plurality of M-bit units of an N-bit group of the plurality of N-bit groups further comprises:
   assigning a first logic pattern to a first M-bit unit of the plurality of M-bit units at a first end of the N-bit group; and
   sequentially assigning additional logic patterns to successive adjacent M-bit units of the plurality of M-bit units, wherein the corresponding logic patterns of adjacent M-bit units of the plurality of M-bit units comprise shared upper and lower boundaries comprising the first or second connection type.

8. The method of claim 6, wherein
   the 0-bit ROM cell configuration comprises:
      the first connection type and another electrical connection between a second S/D region of the transistor and the power supply line,
      the second connection type and another electrical connection between the second S/D region of the transistor and the bit line, or
      one of the first or second connection types and the second S/D region of the transistor electrically isolated from each of the power supply and bit lines, and
   the 1-bit ROM cell configuration comprises:
      the first connection type and another electrical connection between the second S/D region of the transistor and the bit line, or
      the second connection type and another electrical connection between the second S/D region of the transistor and the power supply line.

9. The method of claim 6, wherein the arranging the IC layout features at each boundary to establish each of the first and second connection types comprises overlapping a via region with each of the first S/D region of the transistor and the corresponding power supply line or bit line.

10. The method of claim 1, further comprising:
    generating the one or more logic patterns; and
    storing the one or more logic patterns in the storage device,
    wherein the assigning the one or more logic patterns to each N-bit group of the plurality of N-bit groups comprises retrieving the one or more logic patterns from the storage device.

11. A read-only memory (ROM) integrated circuit (IC) comprising:
    a column of NOR-type ROM bit cells aligned in a column direction, wherein each ROM bit cell comprises a fin field-effect transistor (FinFET) comprising:
       a gate structure extending perpendicular to the column direction; and
       source/drain (S/D) structures adjacent to the gate structure;
    a power supply line and a bit line, each extending in the column direction and overlying each gate structure and S/D structure of the column of ROM bit cells; and
    a plurality of isolation structures configured to divide the column of ROM bit cells into electrically isolated groups of ROM bit cells, wherein
       each pair of adjacent ROM bit cells within each group of ROM bit cells shares a corresponding S/D structure, and
       each group of ROM bit cells of the column of ROM bit cells comprises a total number of ROM bit cells greater than two.

12. The ROM IC of claim 11, wherein the total number of ROM bit cells of each group of ROM bit cells of the column of ROM bit cells is equal to four, and each group of ROM bit cells comprises at least two via structures configured to electrically connect the power supply line or the bit line to an underlying S/D structure of a ROM bit cell transistor.

13. The ROM IC of claim 11, wherein each group of ROM bit cells of the column of ROM bit cells comprises a plurality of units of ROM bit cells, the total number of ROM bit cells of each group of ROM bit cells is a multiple of a total number of ROM bit cells of each unit of each plurality of units of ROM bit cells, and each location corresponding to adjacent units of each plurality of units of ROM bit cells comprises a via structure configured to electrically connect the power supply line or the bit line to the corresponding underlying shared S/D structure.

14. The ROM IC of claim 11, wherein each ROM bit cell of the column of ROM bit cells comprises a via structure configured to electrically connect the power supply line or the bit line to an underlying S/D structure of the corresponding ROM bit cell transistor.

15. A method of manufacturing a read-only memory (ROM) integrated circuit (IC), the method comprising:

forming a column of NOR-type ROM bit cells aligned in a column direction, wherein the forming each ROM bit cell comprises forming a fin field-effect transistor (Fin-FET) by:

constructing a gate structure extending perpendicular to the column direction; and forming source/drain (S/D) structures adjacent to the gate structure;

forming a plurality of isolation structures configured to divide the column of ROM bit cells into electrically isolated groups of ROM bit cells; and constructing a power supply line and a bit line, each extending in the column direction and overlying each gate structure and S/D structure of the column of ROM bit cells, wherein each pair of adjacent ROM bit cells within each group of ROM bit cells shares a corresponding S/D structure, and each group of ROM bit cells of the column of ROM bit cells comprises a total number of ROM bit cells greater than two.

16. The method of claim 15, wherein the total number of ROM bit cells of each group of ROM bit cells of the column of ROM bit cells is equal to four, and the forming the column of ROM bit cells comprises forming at least two via structures in each group of ROM bit cells, wherein each via structure is configured to electrically connect the power supply line or the bit line to an underlying S/D structure of a corresponding ROM bit cell transistor.

17. The method of claim 15, wherein each group of ROM bit cells of the column of ROM bit cells comprises a plurality of units of ROM bit cells, the total number of ROM bit cells of each group of ROM bit cells is a multiple of a total number of ROM bit cells of each unit of each plurality of units of ROM bit cells, and the forming the column of ROM bit cells comprises forming a via structure at each location corresponding to adjacent units of each plurality of units of ROM bit cells, wherein each via structure is configured to electrically connect the power supply line or the bit line to a corresponding underlying shared S/D structure.

18. The method of claim 15, wherein the forming the column of ROM bit cells comprises forming a via structure in each ROM bit cell of the column of ROM bit cells, wherein each via structure is configured to electrically connect the power supply line or the bit line to an underlying S/D structure of the corresponding ROM bit cell transistor.

19. The ROM IC of claim 11, wherein each isolation structure of the plurality of isolation structures comprises one of:

a dielectric volume between active areas of adjacent groups of ROM bit cells of the column of ROM bit cells; or a dummy gate structure.

20. The method of claim 15, wherein the forming the plurality of isolation structures comprises one of:

forming dielectric volumes between active areas of adjacent groups of ROM bit cells of the column of ROM bit cells; or forming dummy gate structures.

* * * * *